US010964575B2

(12) United States Patent
Sugita et al.

(10) Patent No.: US 10,964,575 B2
(45) Date of Patent: Mar. 30, 2021

(54) TRANSFER ROBOT SYSTEM, TEACHING METHOD AND WAFER RECEPTACLE

(71) Applicant: Tokyo Electron Limited, Tokyo (JP)

(72) Inventors: Kippei Sugita, Miyagi (JP); Kenji Nagai, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/565,582

(22) Filed: Sep. 10, 2019

(65) Prior Publication Data

US 2020/0161154 A1 May 21, 2020

(30) Foreign Application Priority Data

Nov. 15, 2018 (JP) .............................. JP2018-214483

(51) Int. Cl.
*H01L 21/68* (2006.01)
*H01L 21/687* (2006.01)

(52) U.S. Cl.
CPC ...... *H01L 21/681* (2013.01); *H01L 21/68707* (2013.01)

(58) Field of Classification Search
CPC .............. H01L 21/681; H01L 21/68707; H01L 21/67265
See application file for complete search history.

(56) References Cited

U.S. PATENT DOCUMENTS

| 4,885,709 | A | * | 12/1989 | Edgar | ................... G01B 11/06 |
| | | | | | 702/30 |
| 10,354,896 | B2 | * | 7/2019 | Sugita | ............... H01L 21/67259 |
| 2005/0086024 | A1 | * | 4/2005 | Seeberger, Jr. | ... H01L 21/67265 |
| | | | | | 702/150 |
| 2007/0216893 | A1 | * | 9/2007 | Yasuda | ............... G03F 7/70725 |
| | | | | | 355/72 |
| 2017/0299407 | A1 | * | 10/2017 | Li | ........................ G01D 5/2412 |
| 2018/0301322 | A1 | * | 10/2018 | Sugita | ................ G01B 11/0625 |

FOREIGN PATENT DOCUMENTS

JP 2009-049250 3/2009

* cited by examiner

*Primary Examiner* — Lynn E Schwenning
(74) *Attorney, Agent, or Firm* — Pearne & Gordon LLP

(57) ABSTRACT

A transfer robot system includes a transfer robot configured to transfer a wafer under an operational instruction; a controller configured to output the operational instruction to the transfer robot; a wafer receptacle; and an interferometer. The wafer receptacle comprises a receptacle body having an open front through which an end effector and the wafer pass; a first reflector disposed under a support space; and a first optical element disposed above the support space to face the first reflector, configured to output the light toward the first reflector and receive received light therefrom. The interferometer calculates an optical interference peak, which is generated between the wafer and the first reflector, based on the received light. The controller determines a taught position of the transfer robot based on a variation of the optical interference peak during an operation of the transfer robot.

14 Claims, 13 Drawing Sheets

TRANSFER ROBOT SYSTEM, TEACHING METHOD AND WAFER RECEPTACLE

CROSS-REFERENCE TO RELATED APPLICATION

This application claims the benefit of Japanese Patent Application No. 2018-214483 filed on Nov. 15, 2018, the entire disclosure of which is incorporated herein by reference.

TECHNICAL FIELD

The various aspects and embodiments described herein pertain generally to a transfer robot system, a teaching method and a wafer receptacle.

BACKGROUND

Patent Document 1 describes a cassette stage. The cassette stage mounts thereon a cassette accommodating wafers therein. The cassette stage is equipped with three optical sensors at a front side of the cassette. A taught position is determined based on a position obtained when an end effector attached to a distal end of an arm blocks an optical axis of the sensor.

Patent Document 1: Japanese Patent Laid-open Publication No. 2009-049250

SUMMARY

In one exemplary embodiment, there is provided a transfer robot system. The transfer robot system includes a transfer robot, a controller, a wafer receptacle and an interferometer. The transfer robot has an arm and an end effector attached to the distal end of the arm, and is configured to transfer a wafer under an operational instruction. The controller is configured to output the operational instruction to the transfer robot. The wafer receptacle accommodates the wafer. The interferometer has a light source configured to emit light, and is connected to the wafer receptacle. The wafer receptacle comprises a receptacle body, pairs of support ribs, a first reflector and a first optical element. The receptacle body has, at an open front through which the end effector and the wafer are allowed to pass, a top plate, two side plates and a bottom plate. The pairs of support ribs are configured to support the wafer horizontally. The first reflector is disposed on an inner face of the bottom plate. The first optical element is disposed on the top plate so as to face the first reflector, and is configured to output the light emitted from the light source toward the first reflector and configured to receive reflected light from the first reflector. The interferometer converts a reflected light spectrum into an interference spectrum. Here, the reflected light spectrum is based on the reflected light received by the first optical element, and the interference spectrum is generated between the wafer supported by the support ribs and the first reflector. The controller determines a taught position based on a variation in the interference spectrum during an operation of the transfer robot under the operational instruction.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
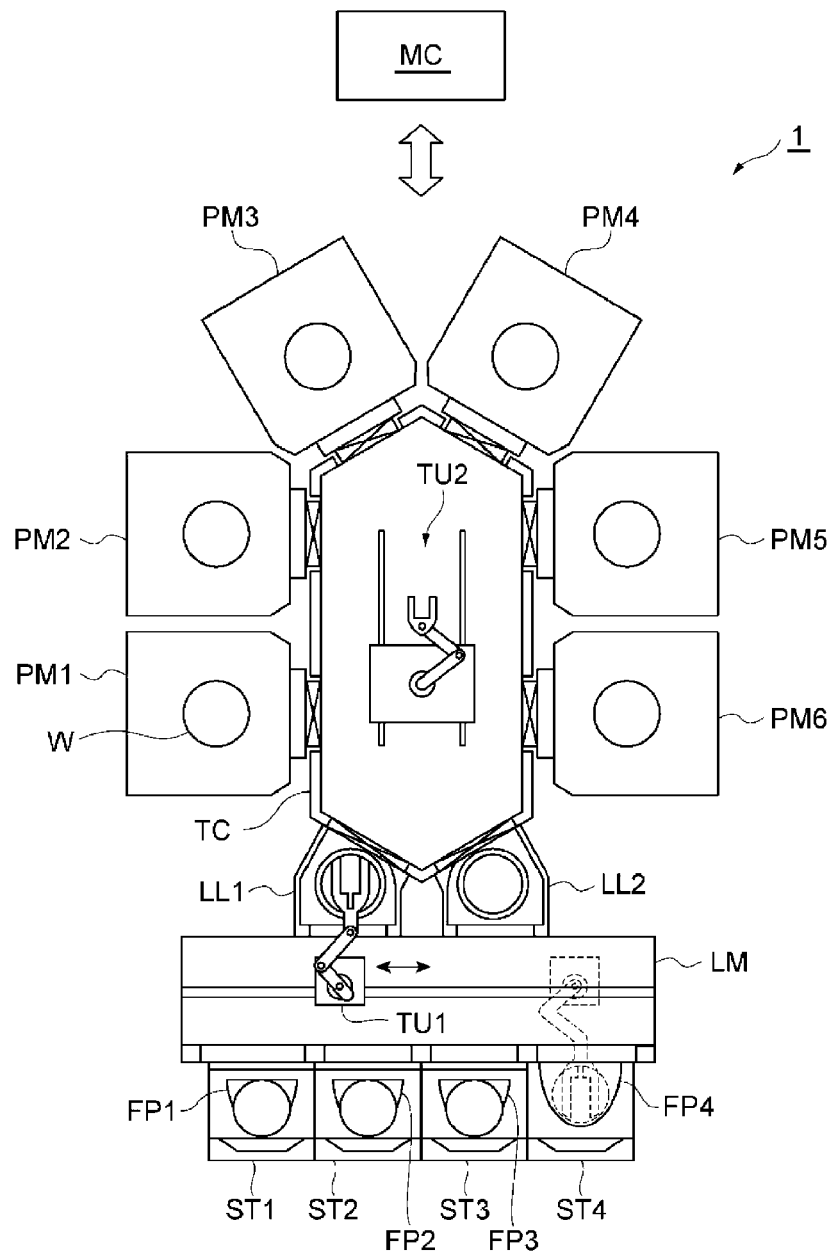
FIG. 1 is a schematic diagram illustrating an example of a substrate processing system equipped with a transfer robot system according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, various exemplary embodiments will be described.

In an apparatus described in Patent Document 1, a taught position of a transfer robot is set to be an outside of a wafer receptacle. To elaborate, a sensor is fixed to a stage on which the wafer receptacle is placed, and the taught position is determined based on a sensor detection result. Since an end effector of the transfer robot advances into an inside of the wafer receptacle and holds a wafer, accurate teaching can be carried out if the taught position is located at the inside of the wafer receptacle. As an example of a specific problem, in the apparatus described in Patent Document 1, if there is a failure in assembling the wafer receptacle and the stage, the wafer cannot be transferred accurately even if the taught position is accurate.

Exemplary embodiments provide a transfer robot system capable of determining a taught position in a support space for the wafer, a teaching method and a wafer receptacle.

In one exemplary embodiment, there is provided a transfer robot system. The transfer robot system includes a transfer robot, a controller, a wafer receptacle and an interferometer. The transfer robot has an end effector and is configured to transfer a wafer under an operational instruction. The controller is configured to output the operational instruction to the transfer robot. The wafer receptacle accommodates the wafer. The interferometer has a light source configured to emit light, and is connected to the wafer receptacle. The wafer receptacle comprises a receptacle body, a first reflector and a first optical element. The receptacle body has, at a front thereof, an opening through which the end effector and the wafer pass, and has a supporting member configured to support the wafer horizontally in a support space therein. The first reflector is disposed below the support space within the receptacle body. The first optical element is disposed above the support space to face the first reflector, and is configured to output the light emitted from the light source toward the first reflector and configured to receive reflected light from the first reflector. The interferometer calculates an optical interference peak, which is generated between the wafer supported by the supporting member and the first reflector, based on the reflected light received by the first optical element. The controller determines a taught position based on a variation in the optical interference peak during an operation of the transfer robot under the operational instruction.

According to the transfer robot system, the light is outputted from the first optical element disposed above the support space of the wafer toward the first reflection member disposed below the support space. This output light reaches the first reflection member after passing through the object located on the optical path. Then, the light is reflected by the first reflection member, and the reflection light arrives at the first optical element after passing through the object located on the optical path. The optical interference intensity distribution having the optical interference peak in which the thickness and the position of the object located on the optical path is included is obtained based on the reflection light by the optical interference device. If the end effector of the transfer robot blocks the optical path of the first optical element, the optical interference peak disappears. Alternatively, if the end effector of the transfer robot lifts up the wafer, the position of the optical interference peak is shifted. The teaching position of the transfer robot is determined by the controller based on the variation of the optical interference peak during the operation of the transfer robot which is carried out based on the operational instruction. As stated above, according to the transfer robot system, the teaching position in the support space of the wafer can be obtained.

The transfer robot system may further include a second reflector, a second optical element, a third reflector and a third optical element. The second reflector is disposed at a different position from the first reflector below the support space within the receptacle body. The second optical element is disposed above the support space to face the second reflector. The second optical element is configured to output the light emitted from the light source toward the second reflector and configured to receive reflected light from the second reflector. The third reflector is disposed at a different position from the first reflector and the second reflector below the support space within the receptacle body. The third optical element is disposed above the support space to face the third reflector. The third optical element is configured to output the light emitted from the light source toward the third reflector and configured to receive reflected light from the third reflector. The interferometer calculates an optical interference peak, which is generated between the wafer supported by the supporting member and the second reflector, based on the reflected light received by the second optical element, and calculates an optical interference peak, which is generated between the wafer supported by the supporting member and the third reflector, based on the reflected light received by the third optical element. The controller determines the taught position of the transfer robot based on a variation in the optical interference peak corresponding to each optical element during the operation of the transfer robot under the operational instruction.

In this configuration, the three pairs of the optical element and the reflector are prepared at the three different positions. The variation of the optical interference peak is acquired by each pair, and the taught position is determined based on these variations. Therefore, accuracy of the taught position of the transfer robot system can be improved.

The controller may evaluate a horizontal posture of the wafer based on the variation of the optical interference peak corresponding to the respective optical elements during the operation of the transfer robot under the operational instruction. If the wafer is inclined, a contact height between the wafer and the end effector may differ depending on a position. Thus, if the three pairs of the optical element and the reflector are provided at the three different positions, the contact height between the wafer and the end effector can be obtained at each of the three different positions. Thus, the transfer robot system is capable of determining whether the wafer is placed horizontally.

The transfer robot may be further equipped with an arm configured to support the end effector. The operational instruction may be an instruction to move the end effector along an elevation axis of the arm below the wafer supported by the supporting member. The controller may determine a position at which the optical interference peak starts to vary to be the taught position of the transfer robot. When the end effector of the transfer robot lifts the wafer up, a position of the optical interference peak is varied depending on a distance between the wafer and the reflector. Thus, this transfer robot system may set a position where the end effector comes into contact with the wafer as the taught position.

The transfer robot may be further equipped with an arm configured to support the end effector. The operational instruction may be an instruction to move the end effector along an expansion axis of the arm below the wafer supported by the supporting member. The controller may determine a position at which the optical interference peak disappears to be the taught position. If the end effector of the transfer robot blocks the optical path of the optical element, the optical interference peak generated depending on the distance between the wafer and the reflector disappears. Therefore, this transfer robot system can determined, based on the variation of the position of the optical interference peak, the position where the end effector blocks the optical path of the optical element as the taught position in the middle of the movement of the end effector along the expansion axis.

The transfer robot may be further equipped with an arm configured to support the end effector. The operational instruction may be an instruction to move the end effector along a rotation axis of the arm below the wafer supported by the supporting member. The controller may determine a position at which the optical interference peak disappears to be the taught position. If the end effector of the transfer robot blocks the optical path of the optical element, the optical interference peak generated depending on the distance between the wafer and the reflector disappears. Therefore, this transfer robot system can determined the taught position based on a position at which the end effector blocks the optical path of the optical element in the middle of the movement of the end effector around the rotation axis.

In another exemplary embodiment, there is provided a teaching method of a transfer robot configured to transfer a wafer accommodated in a wafer receptacle. The transfer robot has an end effector and transfers the wafer under an operational instruction. The wafer receptacle comprises a receptacle body, a first reflector and a first optical element. The receptacle body has, at a front thereof, an opening through which the end effector and the wafer pass, and has a supporting member configured to support the wafer horizontally in a support space therein. The first reflector is disposed below the support space within the receptacle body. The first optical element is disposed above the support space to face the first reflector. The first optical element is configured to output light emitted from a light source toward the first reflector and configured to receive reflected light from the first reflector. The teaching method comprises: operating the transfer robot under the operational instruction; calculating an optical interference peak, which is generated between the wafer supported by the supporting member and the first reflector, based on the reflected light received by the first optical element during an operation of the transfer robot; and determining a taught position of the transfer robot based on a variation in the optical interference peak. According to the teaching method, the taught position in the support space of the wafer can be determined.

The wafer receptacle may further comprise a second reflector, a second optical element, a third reflector and a third optical element. The second reflector is disposed at a different position from the first reflector below the support space within the receptacle body. The second optical element is disposed above the support space to face the second reflector. The second optical element is configured to output the light emitted from the light source toward the second reflector and configured to receive reflected light from the second reflector. The third reflector is disposed at a different position from the first reflector and the second reflector below the support space within the receptacle body. The third optical element is disposed above the support space to face the third reflector. The third optical element is configured to output the light emitted from the light source toward the third reflector and configured to receive reflected light from the third reflector. In the calculating of the optical interference peak, an optical interference peak generated between the wafer supported by the supporting member and the second reflector may be calculated based on the reflected light received by the second optical element, and, also, an optical interference peak generated between the wafer supported by the supporting member and the third reflector may be calculated based on the reflected light received by the third optical element. In the determining of the taught position of the transfer robot, the taught position of the transfer robot may be determined based on a variation of the optical interference peak corresponding to the respective optical elements during an operation of the transfer robot which is performed under the operational instruction.

In this configuration, the three pairs of the optical element and the reflector are prepared at the three different positions. The variation of the optical interference peak is acquired by each pair, and the taught position is determined based on these variations. Therefore, in the teaching method, accuracy of the taught position can be improved.

The teaching method may further include evaluating a horizontal posture of the wafer based on the variation in the optical interference peak corresponding to the respective optical elements during the operation of the transfer robot under the operational instruction. If the wafer is inclined, a contact height between the wafer and the end effector may differ depending on a position. Thus, if the three pairs of the optical element and the reflector are provided at the three different positions, the contact height between the wafer and the end effector can be obtained at each of the three different positions. Therefore, in this teaching method, it can be determined whether the wafer is placed horizontally.

The transfer robot may be further equipped with an arm configured to support the end effector. The operational instruction may be an instruction to move the end effector along an elevation axis of the arm below the wafer supported by the supporting member. In the determining of the taught position of the transfer robot, a position at which the optical interference peak starts to be shifted may be set as the taught position of the transfer robot. When the end effector of the transfer robot lifts the wafer up, a position of the optical interference peak is varied depending on a distance between the wafer and the reflector. Thus, in this teaching method, a position at which the end effector comes into contact with the wafer may be determined as the taught position.

The transfer robot may be further equipped with an arm configured to support the end effector. The operational instruction may be an instruction to move the end effector along an expansion axis of the arm below the wafer supported by the supporting member. In the determining of the taught position of the transfer robot, the taught position may be determined based on a position at which the optical interference peak disappears. If the end effector of the transfer robot blocks the optical path of the optical element, the optical interference peak generated depending on the distance between the wafer and the reflector disappears. Therefore, in this teaching method, a position at which the end effectors blocks the optical axis of the optical element in the middle of the movement along the expansion axis can be determined as the taught position based on a variation of a position of the optical interference peak.

The transfer robot may be further equipped with an arm configured to support the end effector. The operational instruction may be an instruction to move the end effector along a rotation axis of the arm below the wafer supported by the supporting member. In the determining of the taught position of the transfer robot, the taught position may be determined based on a position at which the optical interference peak disappears. If the end effector of the transfer robot blocks the optical path of the optical element, the optical interference peak generated depending on the distance between the wafer and the reflector disappears. Therefore, in this teaching method, the taught position may be determined based on a position at which the end effector blocks the optical path of the optical element in the middle of the movement of the end effector around the rotation axis.

In still another exemplary embodiment, there is provided a wafer receptacle. The wafer receptacle comprises a receptacle body, a reflector and an optical element. The receptacle body has, at a front thereof, an opening through which an end effector and a wafer pass, and has a supporting member configured to support the wafer horizontally in a support space therein. The reflector is disposed below the support space within the receptacle body. The optical element is disposed above the support space to face the reflector. The optical element is configured to output light toward the reflector and receive reflected light from the reflector. The optical element is connected to an optical interference system which is configured to emit light to the optical element and detect an optical interference peak generated between the wafer supported by the supporting member and the reflector based on the reflected light. This wafer receptacle can be used to determine the taught position in the support space of the wafer.

The receptacle body may be covered with a film which blocks infrared light. The optical element may output the infrared light supplied from the optical interference system toward the reflector. According to this configuration, a leak of the infrared light from the receptacle can be avoided.

Hereinafter, various exemplary embodiments will be explained in detail with reference to the accompanying drawings. In the following description and the various drawings, same or corresponding parts will be assigned same reference numerals, and redundant description thereof will be omitted. Further, ratios of sizes in the respective drawings do not necessarily coincide with ratios of sizes to be described. "Up," "down," "left," and "right" are based on an illustrated state, and are defined for the convenience of explanation.

FIG. 1 is a schematic diagram illustrating an example of a substrate processing system equipped with a transfer robot system according to the exemplary embodiment. The substrate processing system 1 is equipped with stages ST1 to ST4, wafer receptacles FP1 to FP4, a loader module LM, load lock chambers LL1 and LL2, process modules PM1 to PM6 and a transfer chamber TC.

The stages ST1 to ST4 are arranged along one side of the loader module LM. The wafer receptacles FP1 to FP4 are mounted on the stages ST1 to ST4, respectively. Each of the wafer receptacles FP1 to FP4 is configured to accommodate wafers W therein.

The loader module LM has a chamber wall which forms therein a transfer space in an atmospheric pressure. The loader module LM is equipped with a transfer robot TU1 in this transfer space. The transfer robot TU1 is configured to transfer the wafers W between the receptacles FP1 to FP4 and the load lock chambers LL1 and LL2.

The load lock chambers LL1 and LL2 are provided between the loader module LM and the transfer chamber TC. Each of the load lock chambers LL1 and LL2 provides a preliminary decompression chamber.

The transfer chamber TC is connected to the load lock chambers LL1 and LL2 via gate valves. The transfer chamber TC is configured as an evacuable decompression chamber, and a transfer robot TU2 is accommodated in this decompression chamber. The transfer robot TU2 is configured to transfer the wafer W between the load lock chambers LL1 and LL2 and the process modules PM1 to PM6 and between any two of the process modules PM1 to PM6.

The process modules PM1 to PM6 are connected to the transfer chamber TC via respective gate valves. Each of the process modules PM1 to PM6 is a processing apparatus configured to perform a plasma processing on the wafer W.

In the substrate processing system 1, a series of operations when a processing is performed on a wafer W are as follows, for example. The transfer robot TU1 of the loader module LM takes out the wafer W from one of the wafer receptacles FP1 to FP4 and transfers the wafer W into either one of the load lock chambers LL1 and LL2. Then, the corresponding load lock chamber is decompressed to a preset pressure. Subsequently, the transfer robot TU2 of the transfer chamber TC takes out the wafer W from this load lock chamber and transfers the wafer W into any one of the process modules PM1 to PM6. The wafer W is processed in one or more of the process modules PM1 to PM6. Thereafter, the transfer robot TU2 transfers the wafer W after being processed into either one of the load lock chambers LL1 and LL2 from the process module. Then, the transfer robot TU1 transfers the wafer W from the load lock chamber into any one of the wafer receptacles FP1 to FP4.

The substrate processing system 1 is further equipped with a control device MC (an example of a controller). The control device MC may be a computer including a processor, a storage device such as a memory, a display device, an input/output device, a communication device, and so forth. The above-described series of operations of the substrate processing system 1 are implemented under the control of the control device MC over the individual components of the substrate processing system 1 according to a program stored in the storage device.

Figure 2:
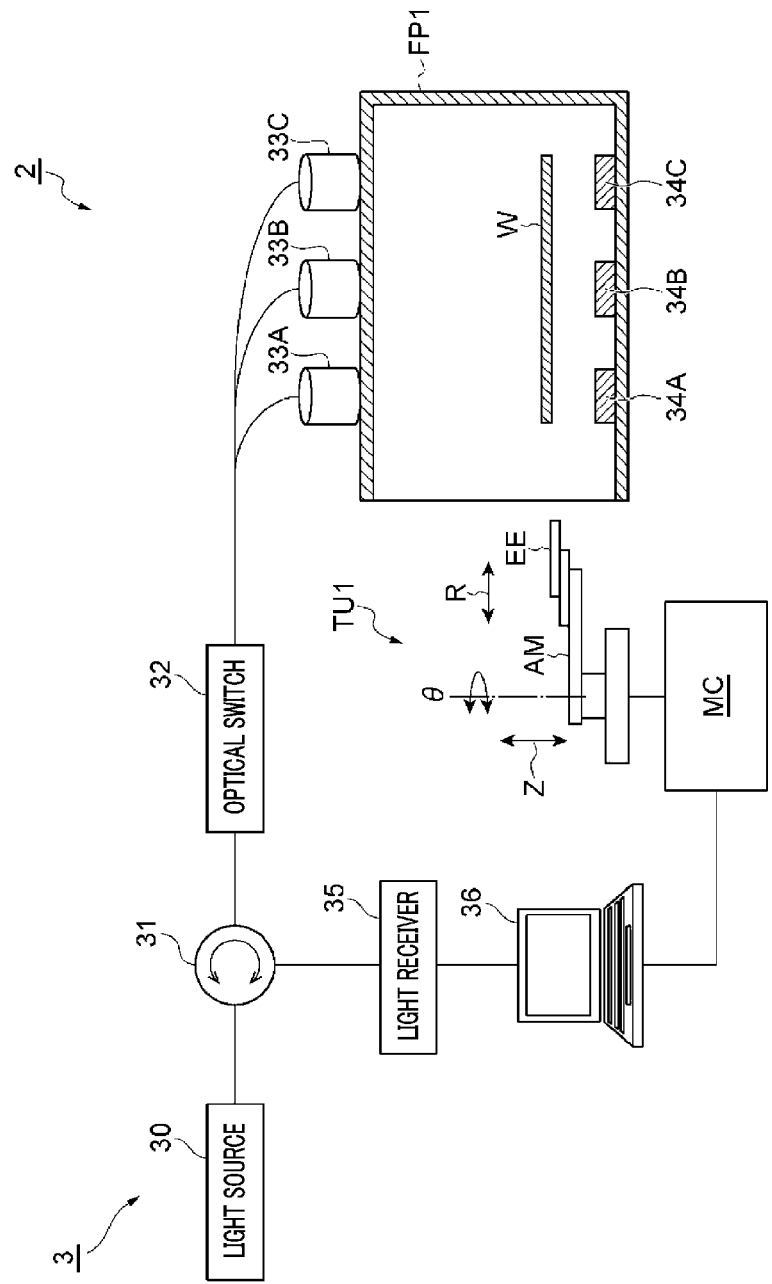
FIG. 2 is a schematic diagram illustrating an example of the transfer robot system according to the exemplary embodiment.

Now, details of the transfer robot system will be explained. FIG. 2 is a schematic diagram illustrating an example of the transfer robot system according to the exemplary embodiment. As depicted in FIG. 2, the transfer robot system 2 includes the aforementioned transfer robot TU1 configured to transfer the wafer W accommodated in the wafer receptacle (in the drawing, the wafer W accommodated in the wafer receptacle FP1, for example).

The transfer robot TU1 has an end effector EE and transfers the wafer W in response to an operational instruction of the control device MC. The control device MC outputs the operational instruction to the transfer robot. The operational instruction is a control target of the transfer robot TU1 and includes a target posture of the transfer robot TU1. The target posture includes a taught position of the end effector EE. The transfer robot TU1 performs a control of moving the end effector EE to the taught position based on the taught position included in the operational instruction. Here, the "taught position" refers to a position of the end effector EE set by a teaching operation.

As an example, the end effector EE may be a pick. However, the end effector EE is not limited to the pick and may be of a type which holds the wafer W by attraction. The end effector EE may be formed of a material which does not transmit light outputted from a light source 30 of an interferometer 3 to be described later. By way of non-limiting example, the end effector EE may be made of ceramic. As a specific example, the end effector EE may be made of SiC, SiN, alumina ($Al_2O_3$), or the like.

The transfer robot TU1 may be equipped with an arm AM configured to support the end effector EE. As an example, the transfer robot TU1 has an elevation axis Z, an expansion axis R and a rotation axis θ of the arm AM. The end effector EE is configured to be moved, by the arm AM, along the elevation axis Z and the expansion axis R, and pivotable around the rotation axis θ. The transfer robot TU1 operates the arm AM by using control values of the elevation axis Z, the expansion axis R and the rotation axis θ as parameters. Accordingly, the end effector EE can be moved to any required taught position. The transfer robot TU1 determines the control values of the elevation axis Z, the expansion axis R and the rotation axis θ such that the taught position of the end effector EE designated by the control device MC is obtained.

The transfer robot system 2 includes the interferometer 3 configured to determine the taught position and the wafer receptacle FP1. The transfer robot system 2 may be equipped with a multiple number of wafer receptacles in addition to the wafer receptacle FP1.

The interferometer 3 is equipped with the light source 30 configured to emit the light and is connected to the wafer receptacle FP1 in which the wafers W are accommodated. The interferometer 3 acquires an optical interference intensity distribution by using reflected light. The interferometer 3 is equipped with the light source 30, an optical circulator 31, an optical switch 32 and a light receiver 35. The optical switch 32 is connected to a first focuser 33A (an example of a first optical element), a second focuser 33B (an example of a second optical element) and a third focuser 33C (an example of a third optical element) provided at the wafer receptacle FP1. The light receiver 35 is connected to an operation device 36.

The operation device 36 may be a computer including a processor, a storage device such as a memory, a display device, an input/output device, a communication device, and so forth. A series of operations of the interferometer 3 to be described later are carried out under the control of the operation device 36 over the individual components of the interferometer 3 according to a program stored in the storage device. The operation device 36 and the control device MC shown in FIG. 1 may be configured as a single body. Further, the light source 30, the optical circulator 31, the optical switch 32, the first focuser 33A, the second focuser 33B, the third focuser 33C and the light receiver 35 are connected by using optical fibers.

The light source 30 is configured to emit measurement light having a wavelength penetrating an object placed in a measurement environment. By way of example, a wavelength-sweep light source is used as the light source 30. The object placed in the measurement environment may have, by way of example, a plate shape, and has a front surface and a rear surface opposite to the front surface. For example, both of the surfaces of the object placed in the measurement environment may be mirror-polished. By way of non-limiting example, the object placed in the measurement environment may be a window member provided at the wafer receptacle FP1 or the wafer W, and may be made of Si (silicon), $SiO_2$ (quarts), $Al_2O_3$ (sapphire), or the like. An example of the measurement light capable of penetrating the object made of such a material may be infrared light.

The optical circulator 31 is connected to the light source 30, the optical switch 32 and the light receiver 35. The optical circulator 31 propagates the measurement light emitted from the light source 30 to the optical switch 32. The optical switch 32 has one input terminal and three output terminals. The input terminal is connected to the optical circulator 31. The three output terminals are respectively connected to the first focuser 33A, the second focuser 33B and the third focuser 33C via corresponding optical fibers. The optical switch 32 is configured such that an output destination is switchable between these three output terminals. The optical switch 32 receives the light from the optical circulator 31 through the input terminal and outputs the received light to the three output terminals alternately.

Each of the first focuser 33A, the second focuser 33B and the third focuser 33C outputs the measurement light emitted from the light source 30 as output light and receives reflected light. The measurement light is reflected by a constituent component of the wafer receptacle FP1 (for example, a first mirror 34A, a second mirror 34B, a third mirror 34C) and the wafer W accommodated therein. Each of the first focuser 33A, the second focuser 33B and the third focuser 33C propagates the reflected light to the optical switch 32.

The optical switch 32 propagates the reflected lights obtained by the first focuser 33A, the second focuser 33B and the third focuser 33C to the optical circulator 31 alternately. The optical circulator 31 propagates the reflected lights to the light receiver 35. The light receiver 35 measures spectrum of the reflected lights obtained from the light circulator 31. This reflected light spectrum shows an intensity distribution relying on a wavelength or a frequency of the reflected light. The reflected light spectrum is acquired for each focuser. The light receiver 35 outputs the reflected light spectrum to the operation device 36.

The operation device 36 performs Fourier transform on the acquired reflected light spectrum to calculate an optical interference intensity distribution indicating a relationship between an optical path length and a signal intensity. Thus, the interferometer 3 is capable of calculating an optical interference peak generated between the wafer W and the constituent components of the wafer receptacle FP1 (for example, the first mirror 34A, the second mirror 34B and the third mirror 34C to be described later). The operation device 36 outputs the optical interference peak for each focuser to the control device MC. An operation of the control device MC will be elaborate later.

Figure 3:
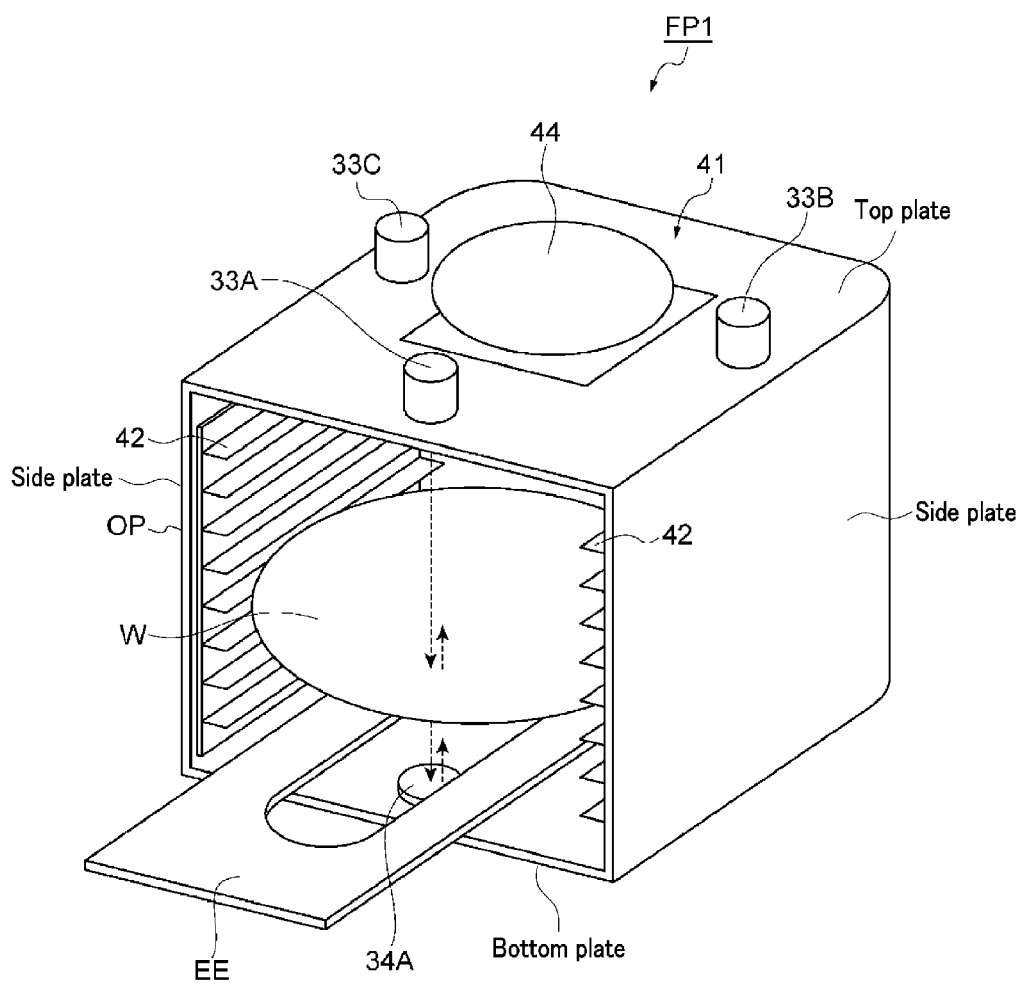
FIG. 3 is a perspective view illustrating an example of a wafer receptacle according to the exemplary embodiment.
Figure 4:
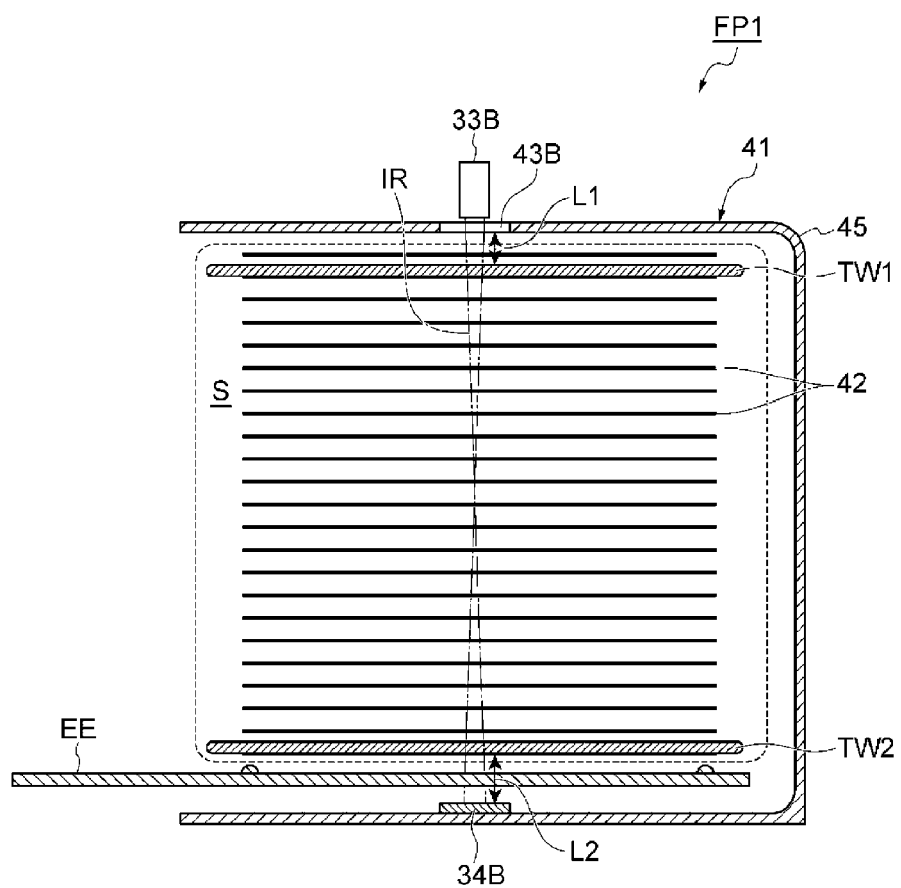
FIG. 4 is a cross sectional view illustrating the example of the wafer receptacle according to the exemplary embodiment.

Now, the wafer receptacles FP1 to FP4 will be explained. Since the wafer receptacles FP1 to FP4 have the same configuration, the wafer receptacle FP1 will be descried on behalf of the others. FIG. 3 is a perspective view illustrating an example of the wafer receptacle according to the exemplary embodiment. FIG. 4 is a cross sectional view illustrating the example of the wafer receptacle according to the exemplary embodiment.

As depicted in FIG. 3 and FIG. 4, the wafer receptacle FP1 is equipped with a receptacle body 41. The receptacle body 41 has a box shape and has therein a space in which the wafers W are accommodated. Formed at the front of the receptacle body 41 is an opening OP through which the end effector EE and the wafer W can pass. The opening OP is closed by a non-illustrated cover when it is not used in the substrate processing system 1.

The receptacle body 41 is equipped with supporting members 42 configured to support the wafers W horizontally within a support space S therein. The supporting members 42 are provided at two opposite side surfaces of the receptacle body 41 to face each other. Each supporting member 42 has a support portion which is protruded horizontally. Each wafer W is horizontally supported from below by a pair of support portions facing each other at the two opposite side surfaces. A height of the support space S ranges from the support portion provided at the lowest position to the support portion provided at the highest position. The end effector EE is capable of lifting the wafer W up from below to allow the wafer W to be spaced apart from the support portions and taking the wafer W out. The end effector EE is also capable of lowering the wafer W down from above, thus allowing the wafer W to be placed on the support portions.

The receptacle body 41 is provided with the first mirror 34A (an example of a first reflector), the second mirror 34B (an example of a second reflector) and the third mirror 34C (an example of a third reflector). Each of the first mirror 34A, the second mirror 34B and the third mirror 34C is a member which specularly reflects the measurement light on a surface thereof.

The first mirror 34A, the second mirror 34B and the third mirror 34C are provided below the support space S within the receptacle body 41. As a more specific example, the first mirror 34A, the second mirror 34B and the third mirror 34C are provided on an inner bottom surface of the receptacle body 41. The first mirror 34A, the second mirror 34B and the third mirror 34C may be placed at different positions. The first mirror 34A may be placed on an axis extending inwards from the front of the receptacle body 41 and passing through a center of the wafer W. The second mirror 34B and the third mirror 34C may be placed on an axis extending toward the two opposite side surfaces of the receptacle body 41 and passing through the center of the wafer W. Here, the second mirror 34B and the third mirror 34C may be symmetrically arranged with respect to the center of the wafer W.

The receptacle body 41 is equipped with the first focuser 33A, the second focuser 33B and the third focuser 33C. The first focuser 33A, the second focuser 33B and the third focuser 33C are provided above the support space S. As a specific example, the first focuser 33A, the second focuser 33B and the third focuser 33C are provided on a top surface of the receptacle body 41, that is, provided at the outside of the receptacle body 41. If the first focuser 33A, the second focuser 33B and the third focuser 33C are provided at the outside of the receptacle body 41, a first window 43A, a second window 43B and a third window 43C are provided on the top surface of the receptacle body 41 to correspond to the focusers 33A to 33C, respectively. Each of the first window 43A, the second window 43B and the third window 43C may be made of a member capable of transmitting the measurement light and the reflected light. One side of each of the first window 43A, the second window 43B and the third window 43C may be coated with an antireflection film.

The first focuser 33A is disposed to face the first mirror 34A, and outputs the measurement light emitted from the light source 30 toward the first mirror 34A and receives the reflected light therefrom. The second focuser 33B is disposed to face the second mirror 34B, and outputs the measurement light emitted from the light source 30 toward the second mirror 34B and receives the reflected light therefrom. The third focuser 33C is disposed to face the third mirror 34C, and outputs the measurement light emitted from the light source 30 toward the third mirror 34C and receives the reflected light therefrom.

At least one pair of the focuser and the mirror needs to be provided. That is, the wafer receptacle FP1 may not be equipped with the pair of the second focuser 33B and the second mirror 34B and the pair of the third focuser 33C and the third mirror 34C, or may be equipped with additional pairs.

A flange 44 for a transfer may be provided on the top surface of the receptacle body 41. With this configuration, the wafer receptacle FP1 can be automatically transferred. A surface of the receptacle body 41 may be covered with an infrared-proof film 45 which blocks the infrared light. With this configuration, a leak of the infrared light from the receptacle body 41 can be suppressed.

The receptacle body 41 is capable of accommodating therein a wafer for use in teaching (hereinafter, simply referred to as "teaching wafer"). The teaching wafer may be the same as the wafer W. The number of the teaching wafer may be at least one. In FIG. 4, the receptacle body 41 accommodates a first teaching wafer TW1 and a second teaching wafer TW2 therein.

Figure 5:
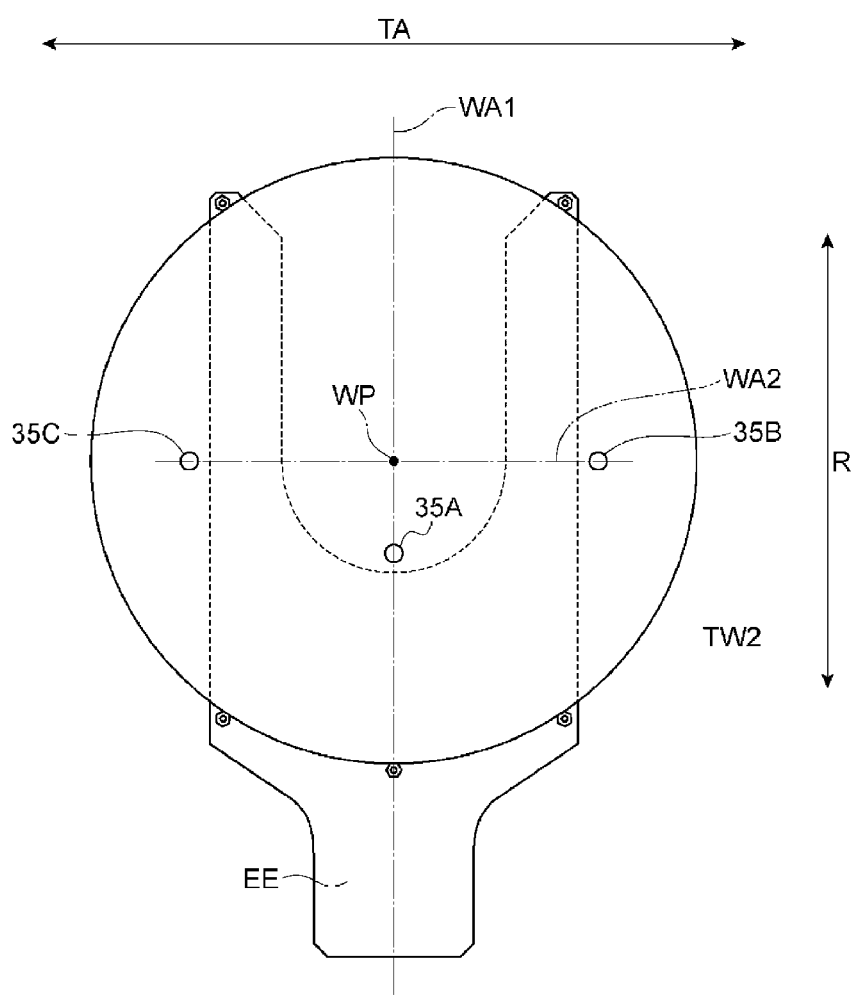
FIG. 5 is a schematic diagram illustrating a relationship between an end effector and an irradiation position.

FIG. 5 is a schematic diagram illustrating an example relationship between the end effector and an irradiation position. A first irradiation position 35A is an irradiation position of the first focuser 33A. A second irradiation position 35B is an irradiation position of the second focuser 33B. A third irradiation position 35C is an irradiation position of the third focuser 33C. The first irradiation position 35A is located on an axis WA1 extending inwards from the front of the receptacle body 41 and passing a center WP of the second teaching wafer TW2. The second irradiation position 35B and the third irradiation position 35C lie on an axis WA2 extending towards the two opposite side surfaces of the receptacle body 41 and passing through the center WP of the second teaching wafer TW2. The second irradiation position 35B and the third irradiation position 35C are arranged symmetrically with respect to the center WP of the second teaching wafer TW2. When viewed from an up-and-down direction, the first irradiation position 35A, the second irradiation position 35B and the third irradiation position 35C may be set not to be overlapped with the end effector EE when the end effector EE is placed at a position where the end effector EE lifts the second teaching wafer TW2 up. In the following description, the position of the end effector EE shown in FIG. 5 will be defined as a "first position".

Now, determining the taught position using optical interference will be explained. As depicted in FIG. 4, light IR outputted from the second focuser 33B reaches the second mirror 34B after passing through the second window 43B, the first teaching wafer TW1 and the second teaching wafer TW2. The light IR are reflected on a rear surface of the second window 43B, a front surface and a rear surface of the first teaching wafer TW1, a front surface and a rear surface of the second teaching wafer TW2 and a surface of the second mirror 34B. These reflections are acquired as a reflected light spectrum by the interferometer 3. Likewise, reflected light spectrums corresponding to the first focuser 33A and the third focuser 33C are also acquired.

Figure 6:
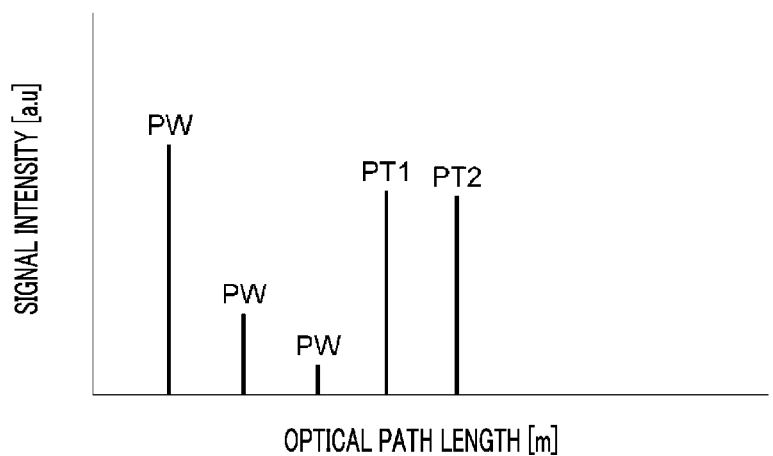
FIG. 6 shows an example of an optical interference intensity distribution when the end effector is located at a reference position.

The reflected light spectrum is subjected to Fourier transform by the interferometer 3, so that the optical interference intensity distribution is obtained. On the optical inference intensity distribution, the optical interference peaks, which are dependent on distances between the individual members, appear. FIG. 6 shows an example of the optical interference intensity distribution when the end effector EE is located at the first position. On the optical interference intensity distribution shown in FIG. 6, a horizontal axis represents an optical path length [m] and a vertical axis indicates a signal intensity [a.u]. Peaks PW are the optical interference peaks which appear due to the reflections on the front surfaces and the rear surfaces of the first and second teaching wafers TW1 and TW2. That is, the peak PW is generated due to a thickness of the wafer. A peak PT1 shown in FIG. 6 is the optical interference peak which corresponds to a distance L1 between the rear surface of the second window 43B and the front surface of the first teaching wafer TW1. Further, a peak PT2 is the optical interference peak which corresponds to a distance L2 between the rear surface of the second teaching wafer TW2 and the front surface of the second mirror 34B.

Furthermore, to monitor the peak PT1 and the peak PT2, these peaks PT1 and PT2 may be set to appear at positions except the positions of the peaks PW which are generated due to the thickness of the wafer W. By way of example, if the thickness of the wafer W is 0.75 mm to 0.8 mm, the first teaching wafer TW1 and the second teaching wafer TW2 may be placed such that the distances L1 and L2 are equal to or larger than 10 mm.

Figure 7:
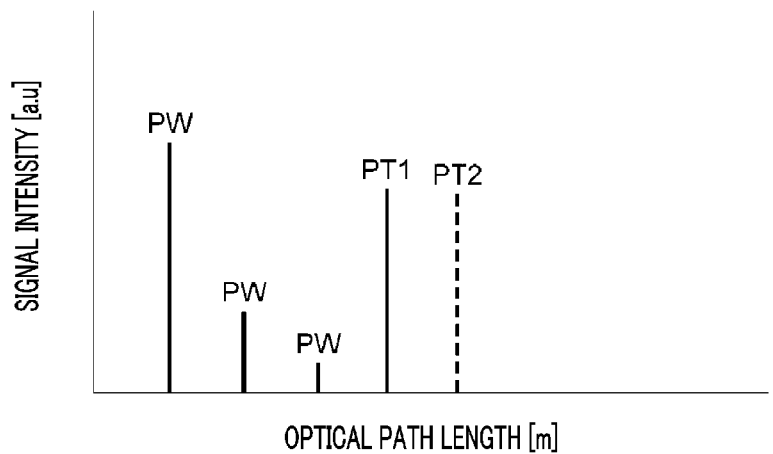
FIG. 7 shows an example of the optical interference intensity distribution when the end effector is moved with respect to an expansion axis or a rotation axis.

Assume that the end effector EE is moved to the right in a left-and-right direction TA from the first position shown in FIG. 5 by a movement of the arm AM around the rotation axis θ. In this case, when viewed from the up-and-down direction, the end effector EE is overlapped with the second irradiation position 35B of the second focuser 33B. If the end effector EE blocks an optical axis of the second focuser 33B in this way, the light IR does not reach the front surface of the second mirror 34B. FIG. 7 shows an example of the optical interference intensity distribution when the end effector is moved along the expansion axis or around the rotation axis. As can be seen from FIG. 7, if the end effector EE blocks the optical axis of the second focuser 33B, the peak PT2 disappears on the optical interference intensity distribution of the second focuser 33B.

Assume that the end effector EE is moved to the left in the left-and-right direction TA from the first position shown in FIG. 5 by the movement of the arm AM around the rotation axis θ. In this case, when viewed from the up-and-down direction, the end effector EE is overlapped with the third irradiation position 35C of the third focuser 33C. If the end effector EE blocks an optical axis of the third focuser 33C in this way, the light IR does not reach the front surface of the third mirror 34C. As can be seen from FIG. 7, when the end effector EE blocks the optical axis of the third focuser 33C, the peak PT2 disappears on the optical interference intensity distribution of the third focuser 33C.

Assume that the end effector EE is moved in a back-and-forth direction along the expansion axis R from the first position shown in FIG. 5 by a movement of the arm AM along the expansion axis R. In this case, when viewed from the up-and-down direction, the end effector EE is overlapped with the first irradiation position 35A of the first focuser 33A. If the end effector EE blocks an optical axis of the first focuser 33A in this way, the light IR does not reach the front surface of the first mirror 34A. As can be seen from FIG. 7, if the end effector EE blocks the optical axis of the first focuser 33A, the peak PT2 disappears on the optical interference intensity distribution of the first focuser 33A.

Figure 8:
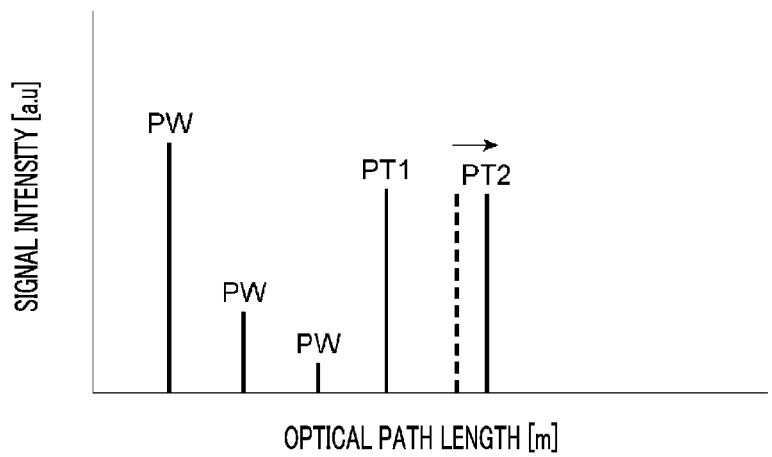
FIG. 8 shows an example of the optical interference intensity distribution when the end effector is moved along an elevation axis.

Assume that the end effector EE is moved up along the elevation axis Z from the first position shown in FIG. 5 by a movement of the arm AM along the elevation axis Z. In this case, the distance L2 between the rear surface of the second teaching wafer TW2 and the front surface of the second mirror 34B shown in FIG. 4 is increased. FIG. 8 shows an example of the optical interference intensity distribution when the end effector is moved along the elevation axis. As depicted in FIG. 8, on the optical interference intensity distribution of the second focuser 33B, the peak PT2 is shifted in a direction in which the distance is increased along with the upward movement of the second teaching wafer TW2 (to the right in the drawing). Likewise, on the optical interference intensity distribution of each of the first focuser 33A and the third focuser 33C, the shift of the peak PT2 is also observed.

The control device MC determines the taught position of the transfer robot TU1 based on the variation of the peak PT2 during the operation of the transfer robot TU1 which is performed under the operational instruction. The control device MC has a function of monitoring the peak PT2. By way of example, the operation device 36 stores the position of the peak PT2 in time series and determines whether the position and the intensity of the peak PT2 has changed.

Figure 9:
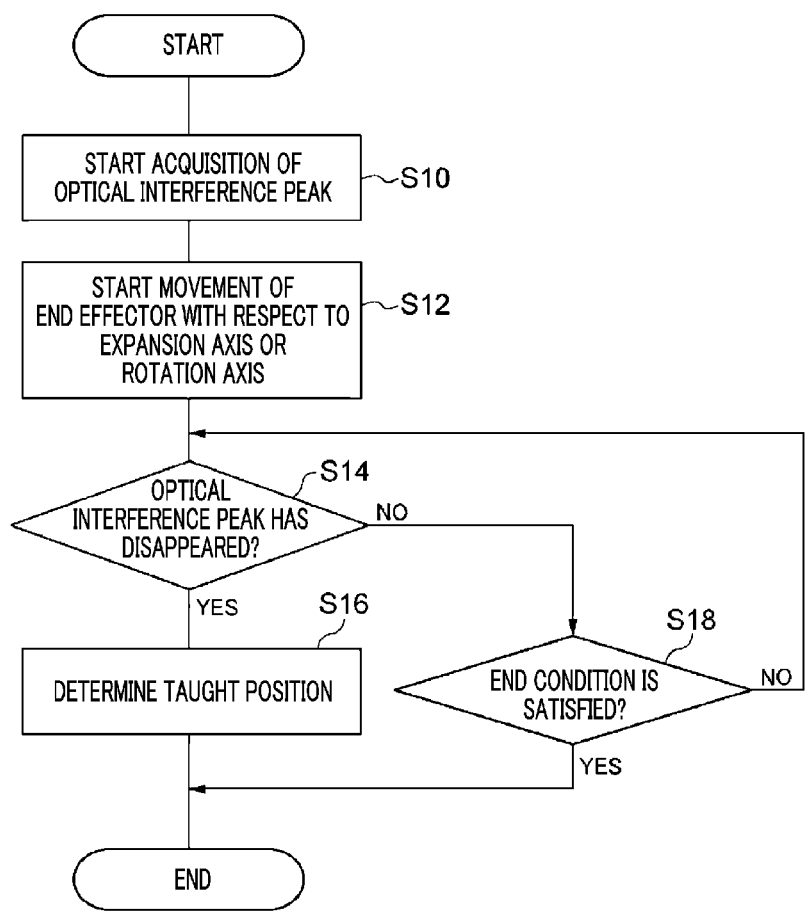
FIG. 9 is an example flowchart of a taught position determination processing.

The control device MC carries out the following operations to determine the taught position of the arm AM with respect to the expansion axis R or the rotation axis θ. FIG. 9 is an example flowchart of a taught position determination processing. Determination upon the taught position of the arm AM with respect to the expansion axis R will be first explained.

As shown in FIG. 9, the interferometer 3 starts acquisition of the optical interference intensity distribution corresponding to the first focuser 33A (process S10). Then, the control device MC outputs, as the operational instruction, to the transfer robot TU1, an instruction to move the end effector EE along the expansion axis R of the arm AM under the second teaching wafer TW2 supported by the supporting members 42. Accordingly, the end effector EE is begun to be moved along the expansion axis R (process S12).

During the operation of the end effector EE, the interferometer 3 acquires the optical interference intensity distribution corresponding to the first focuser 33A. The control device MC finds out a timing when the peak PT2 has disappeared on the optical interference intensity distribution corresponding to the first focuser 33A acquired from the interferometer 3 (process S14).

If it is determined that the peak PT2 has disappeared (process S14: YES), the control device MC sets, as a sensor detection position, the position of the end effector EE at the timing when the peak PT2 has disappeared. Then, the control device MC calculates and determines the taught position of the arm AM with respect to the expansion axis R based on the sensor detection position (process S16). Then, the control device MC ends the taught position determination processing.

If it is found out that the peak PT2 has not disappeared (process S14: NO), the control device MC determines whether the movement of the arm AM along the expansion axis R satisfies an end condition (process S18). If the end condition is met (process S18: YES), the control device MC ends the taught position determination processing. If the end condition is not satisfied (process S18: NO), however, the control device MC carries on the monitoring of the peak PT2. Through the above-described operations, the taught position determination processing shown in FIG. 9 is ended.

Now, determination upon the taught position of the arm AM with respect to the rotation axis θ will be discussed.

As shown in FIG. 9, the interferometer 3 starts acquisition of the optical interference intensity distributions corresponding to the second focuser 33B and the third focuser 33C (process S10). Then, the control device MC outputs, as the operational instruction, to the transfer robot TU1, an instruction to move the end effector EE around the rotation axis θ of the arm AM under the second teaching wafer TW2 supported by the supporting members 42. Accordingly, the end effector EE is begun to be moved around the rotation axis θ (process S12).

During the operation of the end effector EE, the interferometer 3 acquires the optical interference intensity distributions corresponding to the second focuser 33B and the third focuser 33C. The control device MC finds out a timing when the peak PT2 has disappeared on the optical interference intensity distributions corresponding to the second focuser 33B and the third focuser 33C acquired from the interferometer 3 (process S14).

If it is determined that the peak PT2 has disappeared (process S14: YES), the control device MC sets, as the sensor detection positions, the positions of the end effector EE at the timing when the peak PT2 has disappeared. Then, the control device MC calculates and determines the taught position of the arm AM with respect to the rotation axis θ based on the sensor detection position of the second focuser 33B and the sensor detection position of the third focuser 33C (process S16). Then, the control device MC ends the taught position determination processing.

If it is found out that the peak PT2 has not disappeared (process S14: NO), the control device MC determines whether the movement of the arm AM around the rotation axis θ satisfies an end condition (process S18). If the end condition is met (process S18: YES), the control device MC ends the taught position determination processing. If the end condition is not satisfied (process S18: NO), however, the control device MC carries on the monitoring of the peak PT2. Through the above-described operations, the taught position determination processing shown in FIG. 9 is ended.

Figure 10:
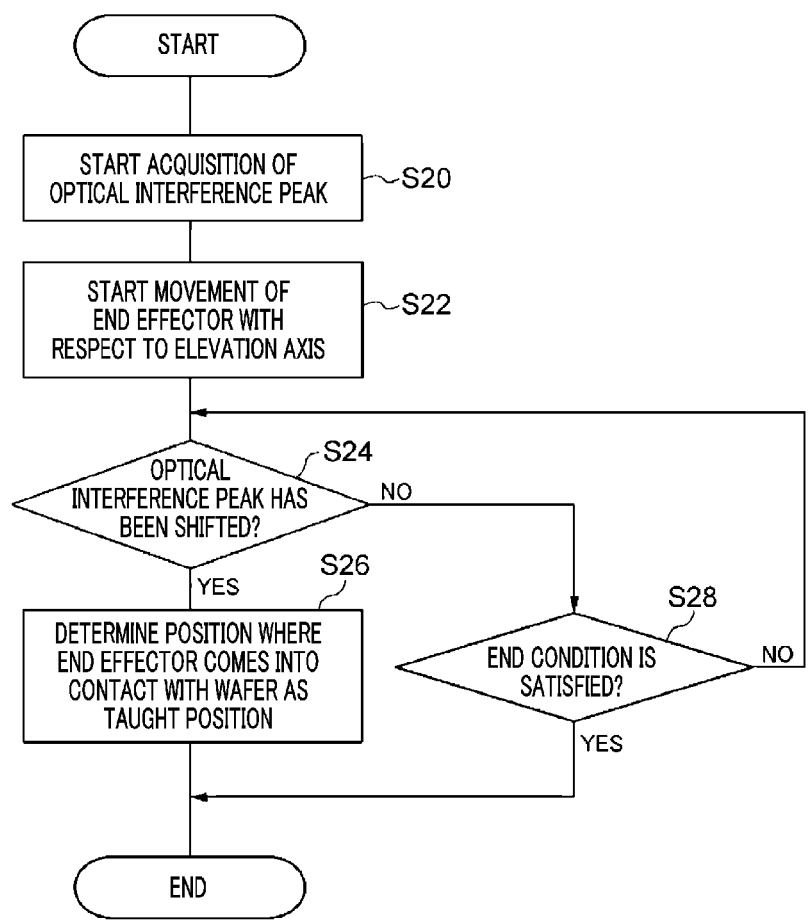
FIG. 10 is an example flowchart of the taught position determination processing.

Now, determination upon the taught position of the arm AM with respect to the elevation axis Z will be discussed. FIG. 10 is an example flowchart of the taught position determination processing therefor.

As shown in FIG. 10, the interferometer 3 starts acquisition of the optical interference intensity distribution corresponding to each focuser (process S20). Then, the control device MC outputs, as the operational instruction, to the transfer robot TU1, an instruction to move the end effector EE around the elevation axis Z of the arm AM under the second teaching wafer TW2 supported by the supporting members 42. Accordingly, the end effector EE is begun to be moved along the elevation axis Z (process S22).

During the operation of the end effector EE, the interferometer 3 acquires the optical interference intensity distribution corresponding to each focuser. The control device MC finds out a timing when the peak PT2 has been shifted on the optical interference intensity distribution corresponding to each focuser acquired from the interferometer 3 (process S24).

If it is determined that the peak PT2 has been shifted (process S24: YES), the control device MC sets, as the sensor detection position, the position of the end effector EE at the timing when the peak PT2 has been shifted. Then, the control device MC sets the sensor detection position as the taught position of the arm AM with respect to the elevation axis Z (process S26). Then, the control device MC ends the taught position determination processing.

If it is found out that the peak PT2 has not been shifted (process S24: NO), the control device MC determines whether the movement of the arm AM with respect to the elevation axis Z satisfies an end condition (process S28). If the end condition is met (process S28: YES), the control device MC ends the taught position determination processing. If the end condition is not satisfied (process 28: NO), however, the control device MC carries on the monitoring of the peak PT2. Through the above-described operations, the taught position determination processing shown in FIG. 10 is ended.

The control device MC may evaluate a horizontal posture of the second teaching wafer TW2 based on the variation of the peak PT2 calculated for each focuser during the operation of the transfer robot TU1 which is performed under the operational instruction. By way of example, the control device MC may determine that the second teaching wafer TW2 has the horizontal posture when the timing of the shift of each peak PT2 is included in a preset range.

The control device MC may evaluate a horizontal posture of the first teaching wafer TW1. In this case, the control device MC lifts the first teaching wafer TW1 up and evaluates the horizontal posture of the first teaching wafer TW1 based on the variation of the peak PT1 calculated for each focuser. The control device MC may determine that the first teaching wafer TW1 has the horizontal posture when the timing of the shift of each peak PT1 is included in a preset range.

The control device MC may make a determination that the wafer receptacle FP1 is not placed on the stage ST1 accurately if neither the first teaching wafer TW1 nor the second teaching wafer TW2 is in the horizontal posture and degrees of inclination of these two teaching wafers are same. As mentioned here, the control device MC may evaluate the degree of inclination of the wafer receptacle FP1. In such a case, a distance between the first teaching wafer TW1 and the second teaching wafer TW2 may be set to be as large as possible.

As stated above, according to the transfer robot system 2, the light is outputted from the first focuser 33A disposed above the support space S of the wafer W toward the first mirror 34A disposed below the support space S. This output light reaches the first mirror 34A after passing through the object located on the optical path. Then, the light is reflected by the first mirror 34A, and the reflected light arrives at the first focuser 33A after passing through the object located on the optical path. The optical interference intensity distribution having the optical interference peak in which the thickness and the position of the object located on the optical path is included is obtained based on the reflected light by the interferometer 3. If the end effector EE of the transfer robot TU1 blocks the optical path of the first focuser 33A, the optical interference peak disappears. Alternatively, if the end effector EE of the transfer robot TU1 lifts up the wafer W, the position of the optical interference peak is shifted. The taught position of the transfer robot TU1 is determined by the control device MC based on the variation of the optical interference peak during the operation of the transfer robot TU1 which is carried out under the operational instruction. As stated above, according to the transfer robot system 2, the taught position in the support space S of the wafer W can be obtained.

According to the transfer robot system 2, the variation of the optical interference peak of each of the first focuser 33A, the second focuser 33B and the third focuser 33C is acquired, and the taught position is determined based on these variations. Thus, the accuracy of the taught position can be improved.

According to the transfer robot system 2, a contact height between the wafer and the end effector at each position can be acquired based on the variations of the optical interference peaks of the first focuser 33A, the second focuser 33B and the third focuser 33C. Therefore, the transfer robot system 2 is capable of determining whether or not the wafer is placed horizontally.

According to the transfer robot system 2, a position where the end effector EE comes into contact with the wafer W may be determined as the taught position.

Experimental Example

Now, an experimental example conducted by the present inventors will be explained. However, it should be noted again that the present disclosure is not limited to these experimental examples.

Figure 11:
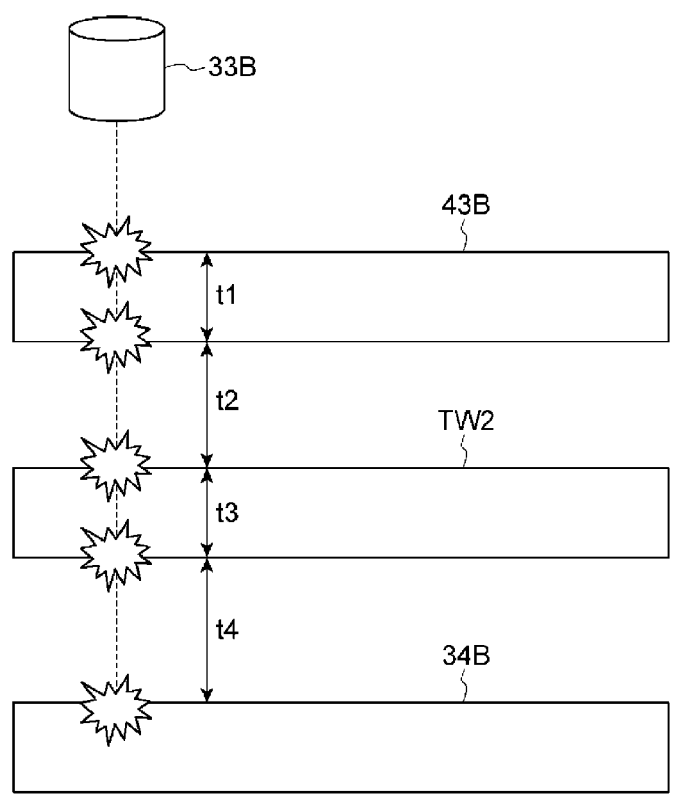
FIG. 11 is a diagram illustrating a measurement position in an experimental example.

The wafer receptacle FP1 according to the exemplary embodiment is used. The wafer receptacle FP1 accommodates only the second teaching wafer TW2 therein. The optical interference intensity distribution corresponding to the second focuser 33B is obtained. A focal length is set to be in the range from 150 mm to 200 mm. FIG. 11 is a diagram illustrating a measurement position in the experimental example. A thickness of the second window 43B is set to be t1; a distance between the second window 43B and the second teaching wafer TW2, t2; a thickness of the second teaching wafer TW2, t3; and a distance between the second teaching wafer TW2 and the second mirror 34B, t4.

The end effector EE is placed at a reference position shown in FIG. 5, and the optical interference intensity distribution is obtained. Then, the end effector EE is moved to the right to block the optical axis of the second focuser 33B, and the optical interference intensity distribution is obtained. The result is shown in FIG. 12.

Figure 12:
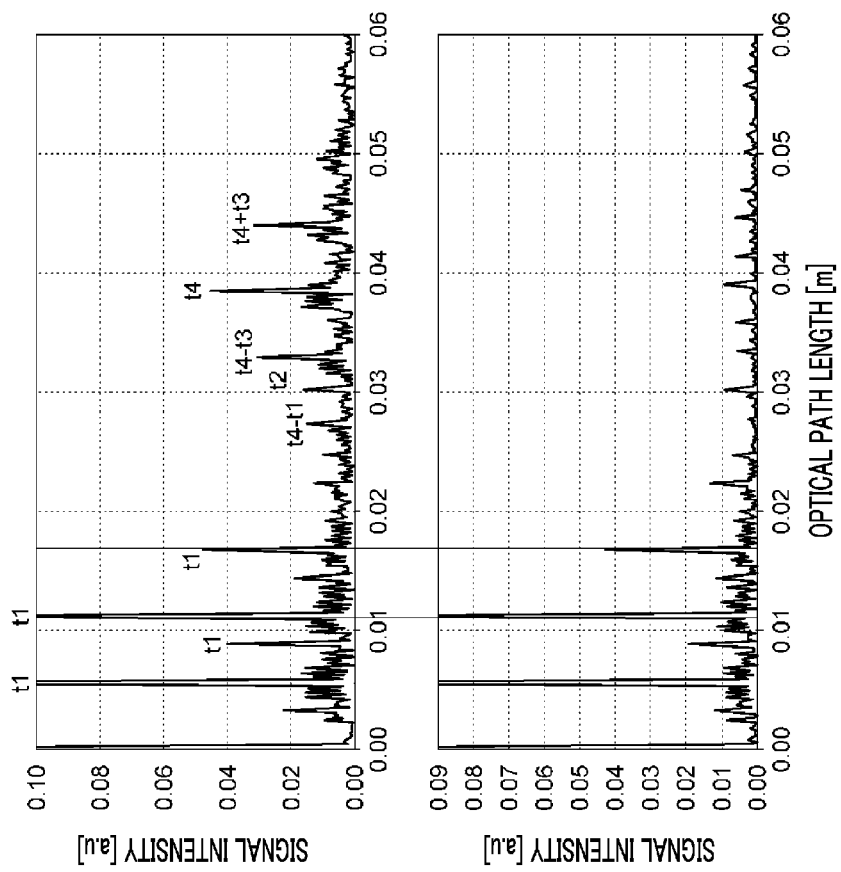
FIG. 12 is a graph showing an example before and after an optical interference peak disappears.

FIG. 12 provides graphs showing an example before and after the optical interference peak disappears. An upper graph in FIG. 12 is the optical interference intensity distribution acquired when the end effector EE is located at the reference position shown in FIG. 5. A lower graph in FIG. 12 is the optical interference intensity distribution acquired when the end effector EE is moved to the position where it blocks the optical axis of the second focuser 33B. As shown in FIG. 12, the optical interference peak corresponding to the distance t4 between the second teaching wafer TW2 and the second mirror 34B is found to disappear. Thus, it is found out that the position of the end effector EE can be detected based on the disappearance of the optical interference peak.

Figure 13:
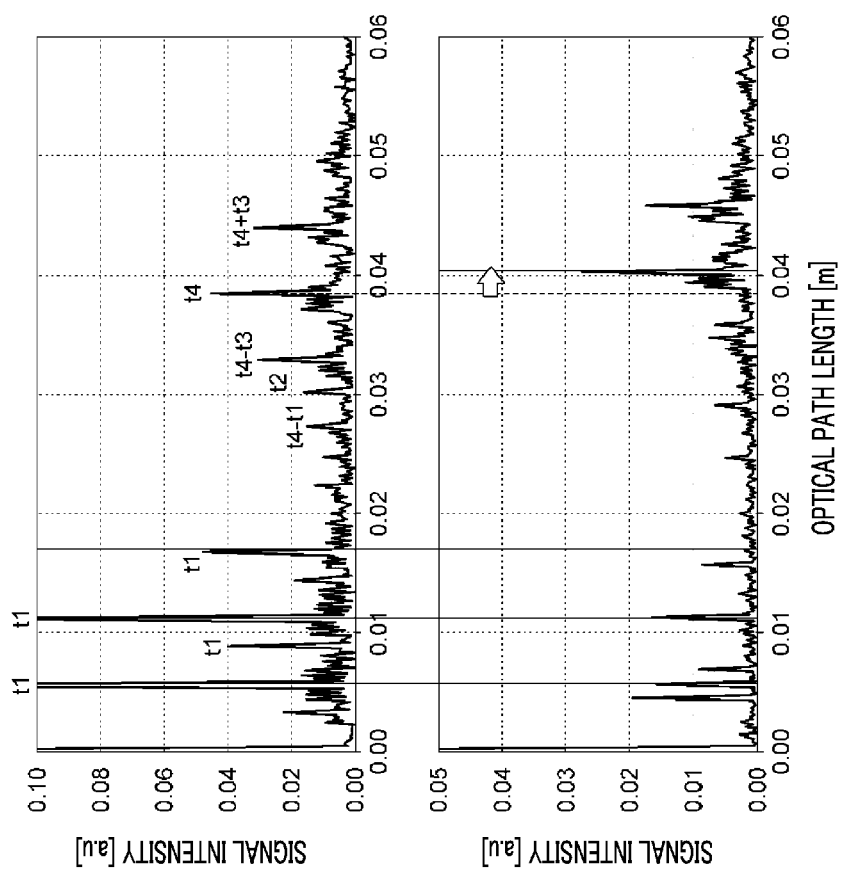
FIG. 13 is a graph showing an example before and after an optical interference peak is shifted.

FIG. 13 provides graphs showing an example before and after the optical interference peak is shifted. An upper graph in FIG. 13 is the optical interference intensity distribution acquired when the end effector EE is located at the reference position shown in FIG. 5. A lower graph in FIG. 13 is the optical interference intensity distribution acquired when the end effector EE lifts up the second teaching wafer TW2. As shown in FIG. 13, the optical interference peak corresponding to the distance t4 between the second teaching wafer TW2 and the second mirror 34B is found to be shifted. Thus, it is found out that a contact position between the end effector EE and the wafer W can be detected based on the shift of the optical interference peak.

So far, the exemplary embodiments have been described. However, it should be noted that the exemplary embodiments are not intended to be anyway limiting. The above exemplary embodiments can be omitted, replaced or modified in various ways. Further, a new exemplary embodiment can be implemented by combining elements in the various exemplary embodiments. For example, the optical element is not limited to the focuser. The optical element is not particularly limited as long as it has the function of irradiating the light to the object and acquiring the reflected light from the object. The optical element may be, by way of non-limiting example, a collimator. Further, a SLD (Super Luminescent Diode) may be used as the light source 30, and a spectrometer may be used as the light receiver 35.

According to the exemplary embodiment, it is possible to determine a taught position in the support space of the wafer.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A transfer robot system, comprising:
a transfer robot having an arm and an end effector attached to a distal end of the arm, the transfer robot being configured to transfer a wafer under an operational instruction;
a controller to output the operational instruction to the transfer robot;
a wafer receptacle accommodating the wafer; and
an interferometer having a light source to emit light, the interferometer being connected to the wafer receptacle, the wafer receptacle comprising:
a receptacle body having an open front through which the end effector and the wafer are allowed to pass, a top plate, two side plates and a bottom plate;
pairs of support ribs configured to support the wafer horizontally;
a first reflector disposed on an inner face of the bottom plate; and
a first optical element disposed on the top plate so as to face the first reflector, the first optical element being configured to output the light emitted from the light source toward the first reflector and to receive reflected light spectrum from the first reflector,
wherein the interferometer converts the reflected light spectrum received by the first optical element into an interference spectrum generated between the wafer supported by the support ribs and the first reflector, and
the controller determines a taught position based on a variation in the interference spectrum during an operation of the transfer robot under the operational instruction.

2. The transfer robot system of claim 1, further comprising:
a second reflector disposed at a different position from the first reflector on the inner face of the bottom plate;
a second optical element disposed on the top plate so as to face the second reflector, the second optical element being configured to output the light emitted from the light source toward the second reflector and to receive reflected light spectrum from the second reflector;
a third reflector disposed at a different position from the first reflector and the second reflector on the inner face of the bottom plate; and
a third optical element disposed on the top plate so as to face the third reflector, the third optical element being configured to output the light emitted from the light source toward the third reflector and to receive reflected light spectrum from the third reflector,
wherein the interferometer converts the reflected light spectrum received by the second optical element into an interference spectrum generated between the wafer supported by the support ribs and the second reflector, and converts the reflected light spectrum received by the third optical element into an interference spectrum generated between the wafer supported by the support ribs and the third reflector, and
the controller determines the taught position based on variations in the interference spectra corresponding to the respective optical elements during the operation of the transfer robot under the operational instruction.

3. The transfer robot system of claim 2,
wherein the controller evaluates a horizontal posture of the wafer based on the variation in the interference spectra corresponding to the respective optical elements during the operation of the transfer robot under the operational instruction.

4. The transfer robot system of claim 1,
wherein the operational instruction is an instruction to move the end effector along an elevation axis of the arm below the wafer supported by the support ribs, and
the controller determines a position at which an interference peak calculated based on the interference spectrum starts to shift as the taught position.

5. The transfer robot system of claim 1,
wherein the operational instruction is an instruction to move the end effector along an expansion axis of the arm below the wafer supported by the support ribs, and
the controller determines a position at which the interference spectrum disappears to be the taught position.

6. The transfer robot system of claim 1,
wherein the operational instruction is an instruction to move the end effector along a rotation axis of the arm below the wafer supported by the support ribs, and
the controller determines a position at which the interference spectrum disappears to be the taught position.

7. A method of teaching a transfer robot having an arm and an end effector attached to a distal end of the arm for transferring a wafer accommodated in a wafer receptacle based on an operational instruction,
the wafer receptacle comprises:
a receptacle body having an open front through which the end effector and the wafer are allowed to pass, a top plate, two side plates, a bottom plate and pairs of support ribs on inner faces of the side plates, each pair of support ribs being configured to support the wafer horizontally;
a first reflector disposed on an inner face of the bottom plate; and
a first optical element disposed on the top plate so as to face the first reflector, the first optical element being configured to output light emitted from a light source toward the first reflector and to receive reflected light spectrum from the first reflector, and
wherein the method comprises:
A) operating the transfer robot under the operational instruction;
B) converting the reflected light spectrum received by the first optical element into an interference spectrum generated between the wafer supported by the support ribs and the first reflector during an operation of the transfer robot; and
C) determining a taught position of the transfer robot based on a variation in the interference spectrum.

8. The method of claim 7,
wherein the wafer receptacle further comprises:
a second reflector disposed at a different position from the first reflector on the inner face of the bottom plate;
a second optical element disposed on the top plate so as to face the second reflector, the second optical element being configured to output the light emitted from the light source toward the second reflector and to receive reflected light spectrum from the second reflector;
a third reflector disposed at a different position from the first reflector and the second reflector on the inner face of the bottom plate; and
a third optical element disposed on the top plate to face the third reflector, the third optical element being configured to output the light emitted from the light source toward the third reflector and to receive reflected light spectrum from the third reflector, and wherein B) comprises converting the reflected light spectrum received by the second optical element into an interference spectrum generated between the wafer supported by the support ribs and the second reflector, and converting the reflected light spectrum received by the third optical element into an interference spectrum generated between the wafer supported by the support ribs and the third reflector, and
C) comprises determining the taught position of the transfer robot based on variations in interference spectra corresponding to the respective optical elements during the operation of the transfer robot under the operational instruction.

9. The method of claim 8, further comprising:
D) evaluating a horizontal posture of the wafer based on the variations in the interference spectra corresponding to the respective optical elements during the operation of the transfer robot under the operational instruction.

10. The method of claim 7,
wherein the operational instruction is an instruction to move the end effector along an elevation axis of the arm below the wafer supported by the support ribs, and
C) determines a position at which an interference peak calculated based on the interference spectrum starts to shift as the taught position of the transfer robot.

11. The method of claim 7,
wherein the operational instruction is an instruction to move the end effector along an expansion axis of the arm below the wafer supported by the support ribs, and
C) determines a position at which the interference spectrum disappears to be the taught position of the transfer robot.

12. The method of claim 7,
wherein the operational instruction is an instruction to move the end effector along a rotation axis of the arm below the wafer supported by the support ribs, and
C) determines a position at which the interference spectrum disappears to be the taught position of the transfer robot.

13. A wafer receptacle, comprising:
a receptacle body having an open front through which an end effector and a wafer are allowed to pass, a top plate, two side plates, a bottom plate and pairs of support ribs disposed on inner faces of the side plates, each pair of support ribs being configured to support the wafer horizontally;
a reflector disposed on an inner face of the bottom plate; and
an optical element disposed on the top plate so as to face the reflector, the optical element being configured to output light toward the reflector and receive reflected light from the reflector,
wherein the optical element is connected to an optical interference system to emit light to the optical element and to detect an interference spectrum generated between the wafer supported by the support ribs and the reflector.

14. The wafer receptacle of claim 13,
wherein the receptacle body is covered with a film blocking infrared light, and
the optical element conducts the infrared light from the optical interference system toward the reflector.

* * * * *